United States Patent
Timpane et al.

(10) Patent No.: US 12,193,142 B2
(45) Date of Patent: *Jan. 7, 2025

(54) GROUND DISCONTINUITIES FOR THERMAL ISOLATION

(71) Applicant: INTERNATIONAL BUSINESS MACHINES CORPORATION, Armonk, NY (US)

(72) Inventors: Trevor Timpane, Rochester, MN (US); Layne A. Berge, Rochester, MN (US); Patryk Gumann, Tarrytown, NY (US); Sean Hart, Tarrytown, NY (US); Curtis Eugene Larsen, Eden Valley, MN (US); Michael Good, Fountain, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/063,136

(22) Filed: Dec. 8, 2022

(65) Prior Publication Data

US 2023/0199936 A1  Jun. 22, 2023

Related U.S. Application Data

(63) Continuation of application No. 16/950,610, filed on Nov. 17, 2020, now Pat. No. 11,558,955.

(51) Int. Cl.
*H05K 1/09* (2006.01)
*G06N 10/00* (2022.01)
(Continued)

(52) U.S. Cl.
CPC ............ *H05K 1/0201* (2013.01); *G06N 10/00* (2019.01); *H05K 1/0225* (2013.01); *H05K 1/09* (2013.01);
(Continued)

(58) Field of Classification Search
CPC .......... H05K 1/0201; H05K 3/02; H05K 1/09; G06N 10/00
See application file for complete search history.

(56) References Cited

U.S. PATENT DOCUMENTS 4,004,119 A    1/1977  Latour
6,722,031 B2   4/2004  Japp et al.
(Continued)

FOREIGN PATENT DOCUMENTS

WO    2018/052466 A1    3/2018
WO    2018/213494 A1    11/2018

OTHER PUBLICATIONS

U.S. Appl. No. 16/950,610, filed Nov. 17, 2020.
(Continued)

*Primary Examiner* — Sherman Ng
(74) *Attorney, Agent, or Firm* — Amin, Turocy & Watson, LLP

(57) ABSTRACT

A quantum mechanical circuit includes a substrate; a first electrical conductor and a second electrical conductor provided on the substrate and spaced apart to provide a gap therebetween; and a third electrical conductor to electrically connect the first electrical conductor and the second electrical conductor. The third electrical conductor is a poor thermal conductor.

18 Claims, 4 Drawing Sheets

(51) Int. Cl.
*H05K 1/02* (2006.01)
*H05K 1/18* (2006.01)
*H05K 3/02* (2006.01)
*H05K 3/32* (2006.01)
*H10N 60/81* (2023.01)
*H05K 1/11* (2006.01)

(52) U.S. Cl.
CPC .............. *H05K 1/18* (2013.01); *H05K 3/02* (2013.01); *H05K 3/32* (2013.01); *H10N 60/81* (2023.02); *H05K 1/023* (2013.01); *H05K 1/115* (2013.01); *H05K 2201/062* (2013.01); *H05K 2201/10363* (2013.01)

(56) References Cited

U.S. PATENT DOCUMENTS

| | | | |
|---|---|---|---|
| 6,885,561 | B1 | 4/2005 | Hashemi et al. |
| 7,462,933 | B2 | 12/2008 | Zhao et al. |
| 7,786,002 | B2* | 8/2010 | Leib ............... H01L 23/481 438/622 |
| 8,598,976 | B2 | 12/2013 | Hetzler |
| 9,332,632 | B2 | 5/2016 | Schneider et al. |
| 10,681,842 | B1 | 6/2020 | Hart et al. |
| 10,756,004 | B1* | 8/2020 | Elsherbini ............ H10N 60/815 |
| 2013/0098671 | A1 | 4/2013 | Thurairajaratnam et al. |
| 2014/0360749 | A1 | 12/2014 | Gao et al. |
| 2016/0104073 | A1* | 4/2016 | Sandberg ........... H10N 60/0912 257/32 |
| 2017/0257074 | A1* | 9/2017 | Yeh ................. H01P 1/227 |
| 2019/0042964 | A1* | 2/2019 | Elsherbini ........... H01L 25/0652 |
| 2019/0043919 | A1* | 2/2019 | George ................. G06N 10/00 |
| 2019/0051966 | A1* | 2/2019 | Pappas ................. H01P 11/003 |
| 2020/0035901 | A1 | 1/2020 | Olivadese et al. |
| 2020/0209330 | A1* | 7/2020 | Popescu ................ G06N 10/00 |
| 2020/0285927 | A1* | 9/2020 | Yabuhara ............ G06K 19/0716 |

OTHER PUBLICATIONS

Examination Report No. 1 received for Australian Patent Application Serial No. 2021382101 dated Aug. 16, 2023, 3 pages.
Rako, Paul "PCB Layout Tips for Thermal Vias", Sep. 17, 2013, Retrieved from https://www.edn.com/pcb-layout-lips-for-thermal-vias, 7 pages.
Dunsworth et al., "A Method for Building Low Loss Multi-Layer Wiring for Superconducting Microwave Devices", Applied Physics Letters, vol. 112, No. 063502, Feb. 6, 2018, XP012226139, pp. 1-4.
Rosenberg et al., "Solid-State Qubits: 3D Integration and Packaging", IEEE Microwave Magazine, vol. 21, No. 8, Aug. 2020, XP011797742, pp. 72-85.
Yeh et al., "Microwave Attenuators for Use with Quantum Devices Below 100 mK", Journal Of Applied Physics, vol. 121, No. 224501, Jun. 8, 2017, XP012219504, 8 pages.
PCT/EP2021/081623 International Search Report dated Feb. 17, 2022, 7 pages.
PCT/EP2021/081623 Written Opinion dated Feb. 17, 2022, 7 pages.
Non Final Office Action received for U.S. Appl. No. 16/950,610 dated May 25, 2022, 29 pages.
Notice of Allowance received for U.S. Appl. No. 16/950,610 dated Sep. 8, 2022, 30 pages.

* cited by examiner

GROUND DISCONTINUITIES FOR THERMAL ISOLATION

BACKGROUND

The currently claimed embodiments of the present invention relate to quantum mechanical circuits, and more specifically, to a quantum mechanical circuit having an electrical conductor that is a poor thermal conductor.

In a typical printed circuit board (PCB), a relatively large continuous ground plane is generally provided. The return current from a signal running across the typical PCB travels uninhibited. While this may be desirable in a normal electrical application, in an electrical application where thermal isolation plays an important role, the electrically conductive continuous ground plane also thermally shorts together everything connected to it. This can create problems in any thermal gradient sensitive application.

Splitting the ground plane where signals need to cross a boundary between two split ground planes is usually avoided entirely in applications where a common electrical ground is needed. A conventional method to mitigate heat transmission is by using capacitors to bridge the gap between the two separated or split ground planes. For thermal gradient sensitive applications, PCBs are typically not used because of the aforementioned thermal shorting issue.

As a result, there remains a need for an electric circuit that reduces heat transmission while allowing electrical conduction. Therefore, it would be desirable to solve this and other problems of the prior art by providing a new kind of circuit for use in a quantum computer, for example a superconducting quantum computer, where heat dissipation or transmission is often not desirable.

SUMMARY

An aspect of the present invention is to provide a quantum mechanical circuit. The quantum mechanical circuit includes a substrate; a first electrical conductor and a second electrical conductor provided on the substrate and spaced apart to provide a gap therebetween; and a third electric conductor to electrically connect the first electrical conductor and the second electrical conductor. The third electrical conductor is a poor thermal conductor.

In an embodiment, the third electrical conductor comprises at least one of Copper-Nickel (CuNi) or stainless steel. In an embodiment, CuNi has an electrical resistivity that is approximately $3.8 \times 10^{-8}$ $\Omega$m at ambient temperature and a thermal conductivity that is between 25 W/m° K and 40 W/m° K. In an embodiment, the first and second electrical conductors comprise copper (Cu). In an embodiment, the first, second and third electrical conductor are configured to transmit a radiofrequency electrical current. In an embodiment, the third electrical conductor is coupled to the substrate using fasteners. In an embodiment, the fasteners comprise brass. In an embodiment, the first and second electrical conductors are connected to electrical ground. In an embodiment, the first and second electrical conductors are electrically decoupled by providing a gap or a channel between the first and second electrical conductors within the substrate. In an embodiment, the quantum mechanical circuit further includes attenuator chips electrically coupled the first and second electrical conductors.

Another aspect of the present invention is a superconducting quantum mechanical computer. The superconducting quantum mechanical computer includes a refrigeration system comprising a temperature-controlled vessel; a quantum processor disposed within the temperature-controlled vessel, the quantum processor comprising a plurality of qubits; and a superconducting circuit disposed inside the temperature-controlled vessel. The superconducting circuit includes a substrate; a first electrical conductor and a second electrical conductor provided on the substrate and spaced apart to provide a gap therebetween; and a third electrical conductor to electrically connect the first electrical conductor and the second electrical conductor, the third electrical conductor being a poor thermal conductor. Each of the plurality of qubits is provided on the substrate and is at least electrically connected to ground via at least one of the first or second electrical conductors.

Yet another aspect of the present invention is to provide a method of manufacturing a quantum mechanical circuit. The method includes providing a substrate having a top face and a bottom face; forming a conductive layer on at least one of the top face and bottom face of the substrate; forming conductor lines in a selected pattern on the substrate by removing portions of the conductive layer, the conductor lines including a first electrical conductor and a second electrical conductor on the substrate, the first electrical conductor and the second electrical conductor being spaced apart and separated by a gap therebetween; and electrically connecting the first electrical conductor and the second electrical conductor using a third electrical conductor, the third electrical conductor being a poor thermal conductor.

BRIEF DESCRIPTION OF THE DRAWINGS

The present disclosure, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

DETAILED DESCRIPTION

Figure 1:
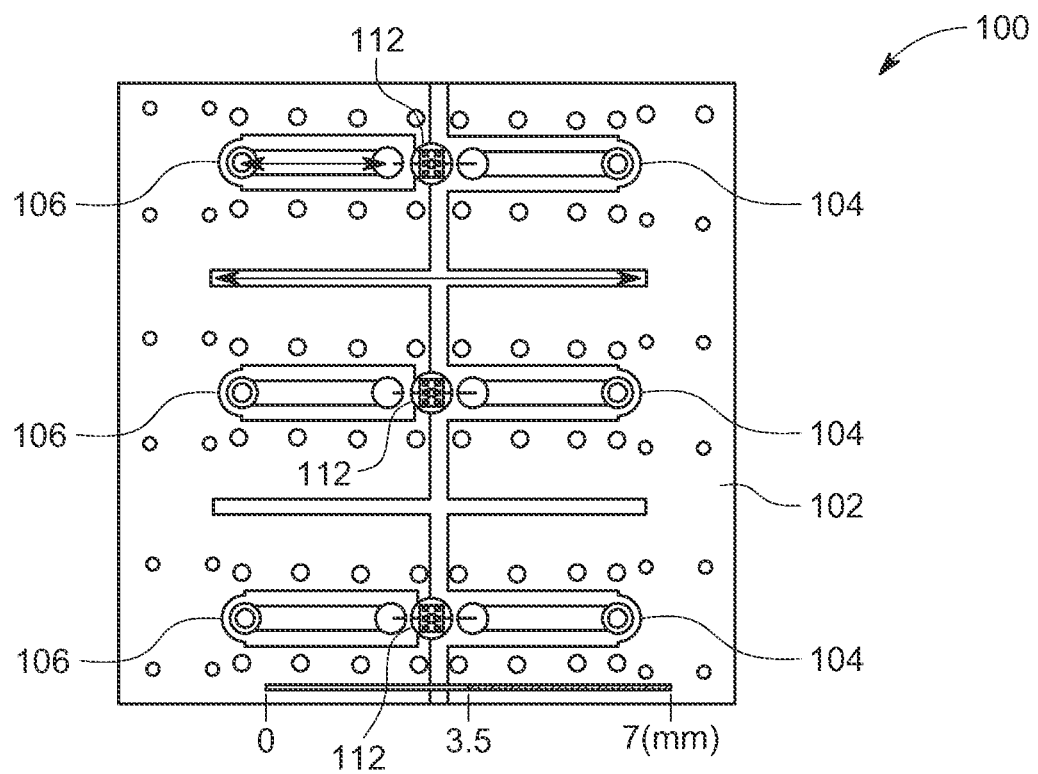
FIG. 1 is an electronic schematic of a quantum mechanical circuit 100, according to an embodiment of the present invention.

FIG. 1 is an electronic schematic of a quantum mechanical circuit 100, according to an embodiment of the present invention. The quantum mechanical circuit 100 includes a substrate 102. The quantum mechanical circuit 100 also includes a first electrical conductor 104, and a second electrical conductor 106 provided on the substrate 102. The quantum mechanical circuit 100 further includes a third electrical conductor 108 (shown in FIG. 2) to electrically connect the first electrical conductor 104 and the second electrical conductor 106. The third electrical conductor 108 is a poor thermal conductor. The term "poor thermal conductor" is used herein broadly to mean the third electrical conductor 108 has a thermal conductivity substantially lower than a thermal conductivity of the first electrical conductor 104 and the thermal conductivity of the second electrical conductor 106. In an embodiment, the material of the third electrical conductor 108 (poor thermal conductor) can be selected to have a sufficiently low thermal conductivity such that the cooling apparatus (e.g., cooling vessel) in which the circuit 100 is used can sufficiently cool the circuit 100 to desired temperatures (e.g., temperatures of operation of the circuit). Selecting a material with a certain thermal conductivity is dependent on a system in which the circuit 100 is used. For example, if the cooling apparatus (e.g., cooling vessel) has enough cooling power, a material with a higher thermal conductivity can be acceptable.

Figure 2:
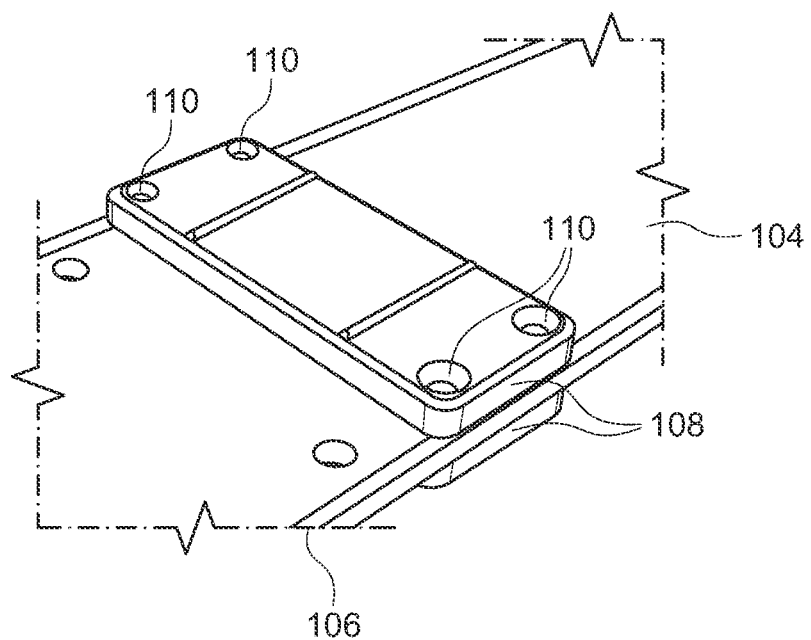
FIG. 2 is a three-dimensional perspective view of electrical coupling between the first electrical conductor, the second electrical conductor, and the third electrical conductor, according to an embodiment of the present invention.

FIG. 2 is a three-dimensional perspective view of electrical coupling between the first electrical conductor 104, the second electrical conductor 106, and the third electrical conductor 108, according to an embodiment of the present invention. As shown in FIG. 2, the third electrical conductor 108 is configured to electrically connect the first electrical conductor 104 and the second electrical conductor 106. In an embodiment, the third electrical conductor 108 includes at least one of Copper-Nickel (CuNi) or stainless steel. In an embodiment, CuNi has an electrical resistivity that is approximately $3.8 \times 10^{-8}$ $\Omega$m at ambient temperature and a thermal conductivity that is between about 25 W/m° K and 40 W/m° K. However, as it must be appreciated other materials having poor thermal conductivity can also be used for the third electrical conductor 108.

In an embodiment, the first electrical conductor 104 and the second electrical conductor 106 include copper (Cu). A material of the third electrical conductor 108 is different from a material of the first electrical conductor 104 and a material of the second electrical conductor 106. In an embodiment, the material of the first electrical conductor 104 and the material of the second electrical conductor 106 can be substantially the same. For example, both the material of the first electrical conductor 104 and the material of the second electrical conductor 106 can be essentially copper (Cu) while the material of the third electrical conductor 108 is essentially CuNi and/or stainless steel. In an embodiment, the substrate 102 is an electrically non-conductive (electrically insulating) material such as silicon (Si), sapphire ($Al_2O_3$), printed circuit board material (e.g., FR-4 (woven glass and epoxy) or other laminate board, fiberglass), or a polymer (e.g., a polyimide), for example.

In an embodiment, the third electrical conductor 108 is coupled to the substrate 102 using fasteners 110. In an embodiment, the fasteners 110 include brass fasteners, for example. However, other types of fasteners can also be used. In addition, in another embodiment, the third electrical conductor 108 can also be coupled to the substrate 102 using other means, such as by using an adhesive.

In an embodiment, the first electrical conductor 104, the second electrical conductor 106 and the third electrical conductor 108 are configured to transmit a radiofrequency (RF) electrical current. In an embodiment, the first electrical conductor 104 and the second electrical conductor 106 are connected to electrical ground potential.

In an embodiment, the first electrical conductor 104 and the second electrical conductor 106 are electrically decoupled by providing a discontinuity, a gap or a channel 112 between the first electrical conductor 104 and the second electrical conductor 106 within the substrate 102. The first electrical conductor 104 and the second electrical conductor 106 are spaced apart to provide the gap 112 therebetween.

Figure 3:
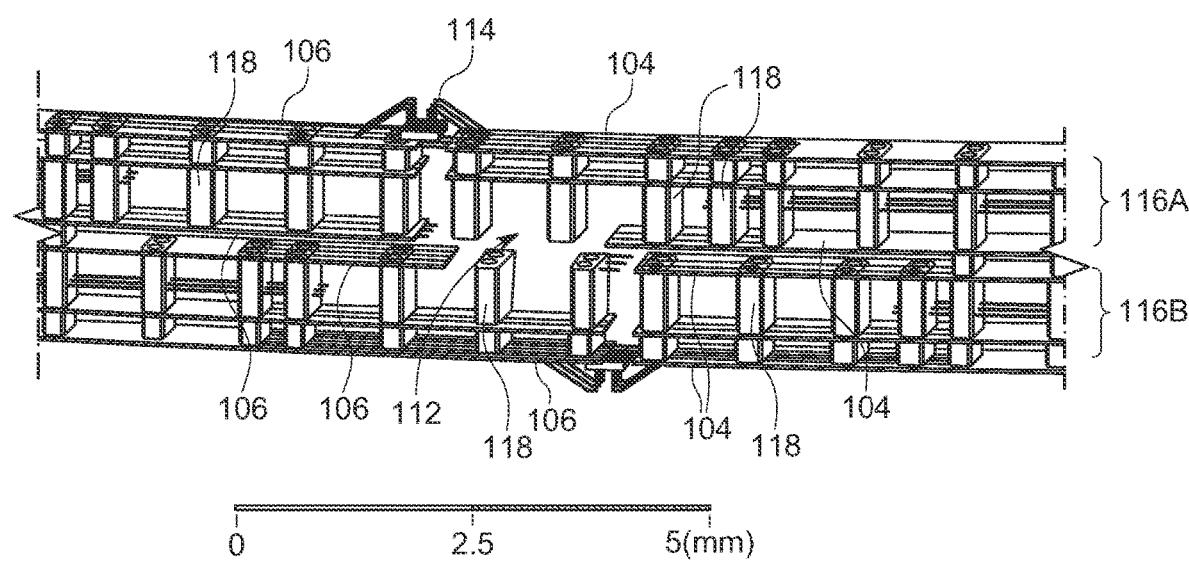
FIG. 3 is a three-dimensional perspective view of a configuration of the first electrical conductor and the second electrical conductor, according to an embodiment of the present invention.

FIG. 3 is a three-dimensional perspective view of a configuration of the first electrical conductor 104 and the second electrical conductor 106, according to an embodiment of the present invention. As shown in FIG. 3, a discontinuity, a gap or channel 112 is provided between the first electrical conductor 104 and the second electrical conductor 106. In embodiment, as shown in FIG. 3, two layers 116A and 116B can be used for signal transmission. For example, the discontinuity, channel or gap 112 in layers 116A and 116B provides improved thermal isolation and helps steer return current. This dual sided configuration provides an increase in density. In addition, in an embodiment, the top and bottom split locations 112 are offset by removing internal ground planes from the internal layers of the substrate 102 (not shown) and by providing blind vias (i.e., vias on layers 116A and 11B that are not aligned with each other) to reduce electrical coupling.

Furthermore, as shown in FIG. 3, attenuator chips 114 can be provided on top and bottom sides of layers 116A and 116B to increase electrical signal isolation. The attenuator chips 114 are electrically coupled (e.g., wire-bonded or soldered, etc.) to the first and second electrical conductors 104 and 106. In an embodiment, the attenuator chips 114 can be wire-bonded or soldered (for example, either surface mount soldered or ball grid array soldered) across the ground split 112. In addition, in other embodiments, other types of components, such as a filter for example, can also be used in addition or alternatively to the attenuator chips 114. In an embodiment, as shown in FIG. 3, removing ground planes internal to the substrate 102 (not shown) by providing the discontinuity or gap 112 in both layers 116A and 116B allows to reduce coupling to increase thermal isolation. Furthermore, vias 118 can be arranged within the substrate 102 (not shown) to allow electrical signals to have proper electromagnetic mode conversion to reduce coupling. In this way, electromagnetic (EM) fields can use the electrical ground potential more efficiently for return current path across the discontinuity 112 in the ground planes (i.e., the discontinuity or gap or channel 112 between the first electrical conductor 104 and the second electrical conductor in both layer 116A and layer 116B). The electrical ground potential is thus provided by the first electrical conductor 104, the second electrical conductor 106 and the third electrical conductor 108 connected to each other and to ground.

Therefore, as it can be appreciated from the above paragraphs, in some embodiments of the present invention, the problem of thermal isolation can be addressed by splitting the ground plane. The ground plane corresponds to the first electrical conductor 104 and the second electrical conductor 106 both connected to electrical ground potential. The splitting in the ground plane thus corresponds to the gap or discontinuity or channel 112 provided between the first electrical conductor 104 ad the second electrical conductor 106. While the gap or channel 112 provides good thermal isolation, this may cause many issues with the return current path. As a result, the third electrical conductor 108 is provided to electrically connect the first electrical conductor 104 and the second electrical conductor 106. However, to provide thermal isolation between the first electrical conductor 104 and the second electrical conductor 106 (in the ground plane in this example), the third electrical conductor 108 is selected as being a poor thermal conductor such as CuNi alloy or Stainless steel, for example. CuNi is relatively a good electrical conductor but a poor thermal conductor.

Figure 4:
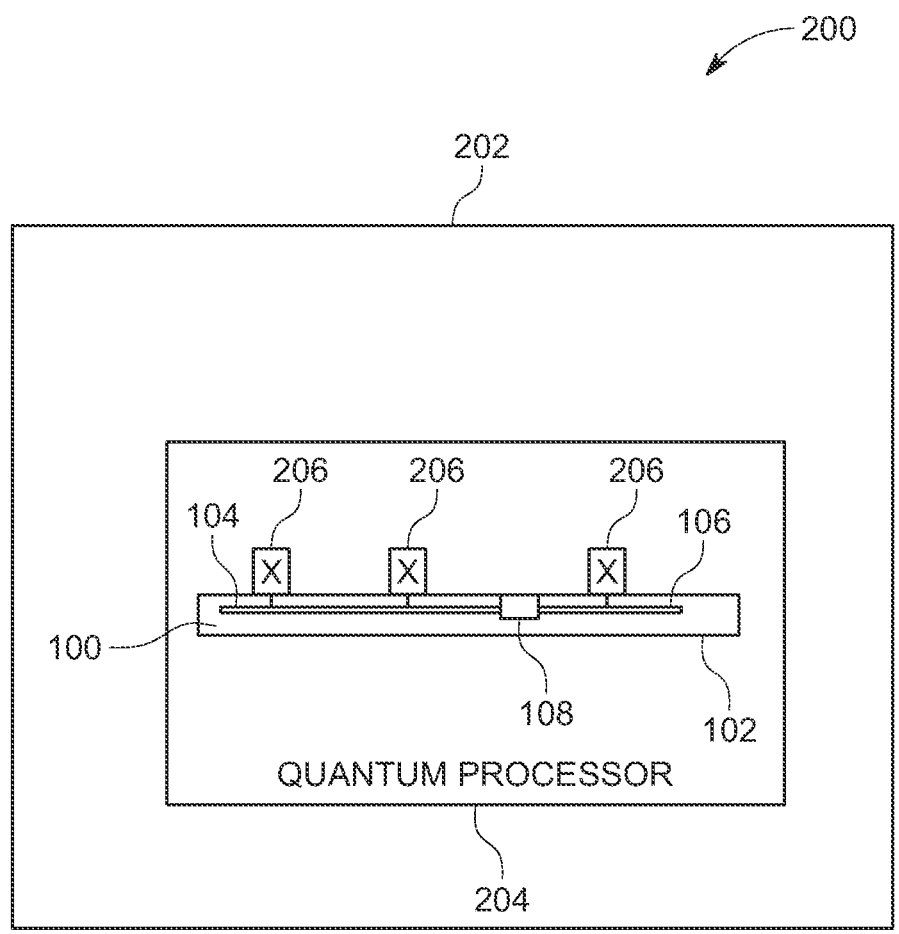
FIG. 4 is a schematic diagram showing a superconducting quantum mechanical computer, according to an embodiment of the present invention.

FIG. 4 is a schematic diagram showing a superconducting quantum mechanical computer 200, according to an embodiment of the present invention. The superconducting quantum mechanical computer 200 includes a refrigeration system comprising a temperature-controlled vessel 202. The superconducting quantum computer includes a quantum processor 204 disposed within the temperature-controlled vessel 202, the quantum processor including a plurality of qubits 206. The superconducting quantum mechanical computer 200 further includes the quantum mechanical circuit 100 disposed inside the temperature-controlled vessel 202. As shown in FIG. 1, the circuit 100 includes the substrate 102, the first electrical conductor 104 and the second electrical conductor 106 provided on the substrate 102. The circuit 100 also includes the third electrical conductor 108 for electrically connecting the first electrical conductor 104 and the second electrical conductor 106, the third electrical conductor 108 being a poor thermal conductor. Each of the plurality of qubits 206 is provided on the substrate 102 and is at least electrically connected to ground via at least one of the first or second electrical conductors 104 and 106.

Figure 5:
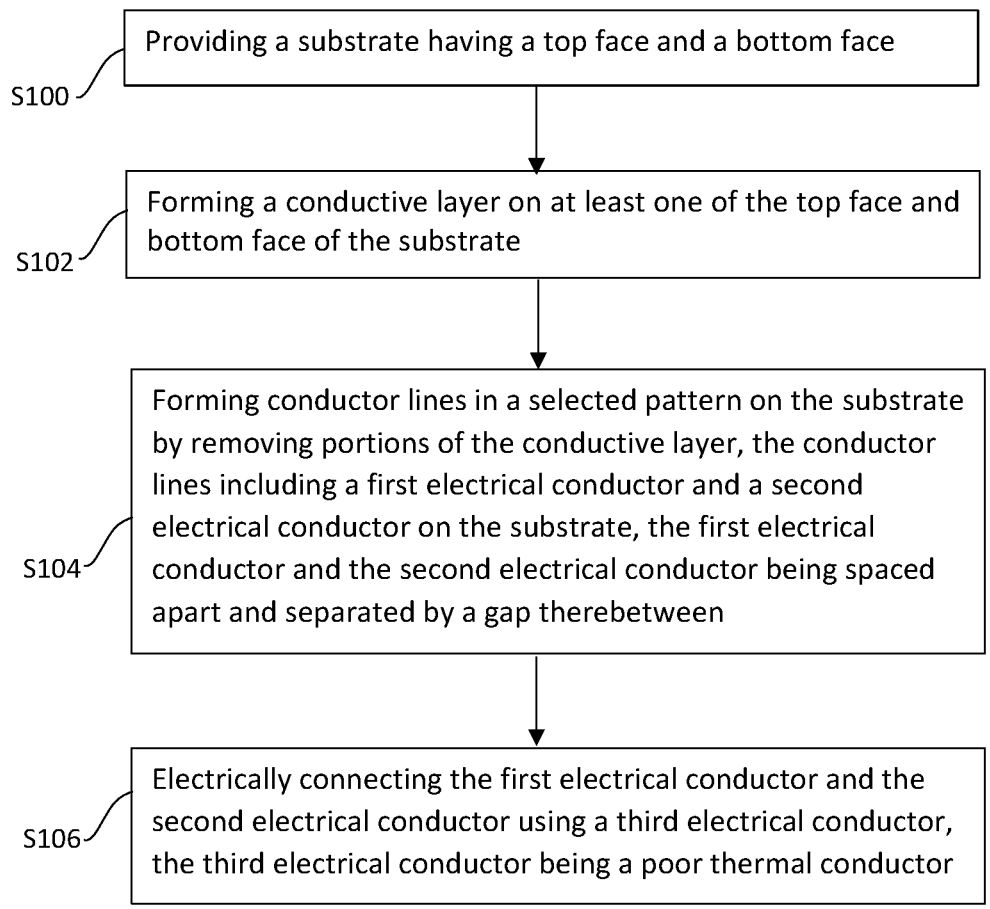
FIG. 5 is a flow chart of a method of manufacturing the quantum mechanical circuit, according to an embodiment of the present invention.

FIG. 5 is a flow chart of a method of manufacturing the quantum mechanical circuit, according to an embodiment of the present invention. The method includes:

1. providing the substrate 102 (e.g., silicon, polymer, laminate board, fiberglass, etc.) having a top face and a bottom face, at S100;
2. forming a conductive layer (e.g., copper layer) on at least one of the top face and bottom face of the substrate, at S102;
3. forming conductor lines in a selected pattern on the substrate 102 by removing portions of the conductive layer, the conductor lines including first electrical conductor 104 and second electrical conductor 106 on the substrate 102, the first electrical 104 and second electrical conductor 106 being spaced apart and separated by a gap therebetween, at S104; and
4. electrically connecting the first electrical conductor 104 and the second electrical conductor 106 using a third electrical conductor 108 (shown in FIG. 2), the third electrical conductor 108 is a poor thermal conductor (e.g., CuNi or stainless steel), at S106. In an embodiment, the first and second electrical conductors 104 and 106 can be connected to electrical ground.

The method further includes, before forming the conductor lines in the selected pattern on the substrate 102:

5. applying a photoresist layer on the conductive layer;
6. applying a light absorbing material on the photoresist layer in the selected pattern so as to cover portions of the photoresist layer corresponding to the selected pattern;
7. irradiating the photoresist layer with electromagnetic radiation (e.g., ultraviolet radiation) to harden areas of the photoresist layer that are not covered by the light absorbing material;
8. removing areas of the photoresist layer corresponding to the covered portions of the photoresist layer that are not hardened by the electromagnetic radiation to expose portions of the conductive layer;
9. etching away the exposed portions of the conductive layer while not etching portions of the conductive layer under the hardened areas of the photoresist;
10. removing the hardened areas of the photoresist layer to expose portions of the conductive layer that are not etched, the portions of the conductive layer not etched corresponding to the selected pattern to form the conductor lines; and
11. forming vias within the substrate at selected locations within the substrate.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A quantum mechanical circuit comprising:
   a substrate;
   a first electrical conductor and a second electrical conductor provided on the substrate and spaced apart to provide a gap therebetween, wherein the first electrical conductor and the second electrical conductor are electrically decoupled by providing the gap between the first electrical conductor and the second electrical conductor within the substrate; and
   a third electrical conductor coupled to the first electrical conductor and the second electrical conductor, wherein the third electrical conductor comprises Copper-Nickel (CuNi) having an electrical resistivity that is approximately $3.8 \times 10^{-8}$ $\Omega m$ at ambient temperature and a thermal conductivity that is between about 25 W/m° K and 40 W/m° K.

2. The quantum mechanical circuit according to claim 1, wherein the third electrical conductor further comprises stainless steel.

3. The quantum mechanical circuit according to claim 1, wherein the first, second and third electrical conductors are configured to transmit a radiofrequency electrical current.

4. The quantum mechanical circuit according to claim 1, wherein the first electrical conductor and the second electrical conductor comprise copper (Cu).

5. The quantum mechanical circuit of claim 2, wherein the third electrical conductor is coupled to the substrate using fasteners.

6. The quantum mechanical circuit according to claim 5, wherein the fasteners comprise brass.

7. The quantum mechanical circuit according to claim 1, wherein the first electrical conductor and the second electrical conductor are connected to electrical ground.

8. The quantum mechanical circuit according to claim 1, further comprising attenuator chips electrically coupled to the first electrical conductor and the second electrical conductor.

9. A superconducting quantum mechanical computer comprising:
   a refrigeration system comprising a temperature-controlled vessel;
   a quantum processor disposed within the temperature-controlled vessel, the quantum processor comprising a plurality of qubits; and
   a superconducting circuit disposed inside the temperature-controlled vessel, the superconducting circuit comprising:

a substrate;

a first electrical conductor and a second electrical conductor provided on the substrate and spaced apart to provide a gap therebetween, wherein the first electrical conductor and the second electrical conductor are electrically decoupled by providing the gap between the first electrical conductor and the second electrical conductor within the substrate; and a third electrical conductor coupled to the first electrical conductor and the second electrical conductor, wherein the third electrical conductor comprises Copper-Nickel (CuNi) having an electrical resistivity that is approximately $3.8 \times 10-8$ $\Omega$m at ambient temperature and a thermal conductivity that is between about 25 W/m° K and 40 W/m° K.

10. The superconducting quantum mechanical computer according to claim 9, wherein the third electrical conductor further comprises stainless steel.

11. The superconducting quantum mechanical computer according to claim 9, wherein the plurality of qubits are provided on the substrate and each of the plurality of qubits is electrically connected to ground via at least one of the first electrical conductor or the second electrical conductor.

12. The superconducting quantum mechanical computer according to claim 9, wherein the first electrical conductor and the second electrical conductor comprise copper (Cu).

13. The superconducting quantum mechanical computer according to claim 10, wherein the first, second and third electrical conductor are configured to transmit a radiofrequency electrical current.

14. The superconducting quantum mechanical computer according to claim 10, wherein the third electrical conductor is coupled to the substrate using fasteners.

15. The superconducting quantum mechanical computer according to claim 9, wherein the first electrical conductor and the second electrical conductor are connected to electrical ground.

16. The superconducting quantum mechanical computer according to claim 9, further comprising attenuator chips electrically coupled to the first electrical conductor and the second electrical conductor.

17. The superconducting quantum mechanical computer according to claim 9, wherein the temperature-controlled vessel is fully enclosed within the refrigeration system.

18. A method of manufacturing a quantum mechanical circuit comprising:

providing a substrate having a top face and a bottom face;

forming a conductive layer on at least one of the top face or the bottom face of the substrate; and forming conductor lines in a selected pattern on the substrate by removing portions of the conductive layer, the conductor lines including a first electrical conductor and a second electrical conductor on the substrate, the first electrical conductor and the second electrical conductor being spaced apart and separated by a gap therebetween, wherein the first electrical conductor and the second electrical conductor are electrically decoupled by providing the gap between the first electrical conductor and the second electrical conductor within the substrate and by providing blind vias through the substrate that are not aligned with one another to reduce electrical coupling between the first electrical conductor and the second electrical conductor.

* * * * *